United States Patent
Chen et al.

(10) Patent No.: US 9,900,975 B2
(45) Date of Patent: Feb. 20, 2018

(54) CHIP HEATER AND HEATING AID ARRANGEMENT

(71) Applicant: ADLINK TECHNOLOGY INC., New Taipei (TW)

(72) Inventors: Jen-Shi Chen, New Taipei (TW); Chih-Liang Fang, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 0 days.

(21) Appl. No.: 15/081,522

(22) Filed: Mar. 25, 2016

(65) Prior Publication Data

US 2017/0280555 A1    Sep. 28, 2017

(51) Int. Cl.
*H05K 1/18* (2006.01)
*H05K 1/02* (2006.01)

(52) U.S. Cl.
CPC .......... *H05K 1/0212* (2013.01); *H05K 1/18* (2013.01)

(58) Field of Classification Search
CPC ........... G06F 1/206; G06F 1/183; H05B 3/26; H05K 1/0203; H05K 1/181; H05K 2201/10159; H05K 2201/10409; H05K 1/0212; H05K 1/18
USPC ........ 324/760, 767; 219/209, 221, 226, 234; 361/717, 679.47, 700, 695, 704
See application file for complete search history.

(56) References Cited

U.S. PATENT DOCUMENTS

| 7,042,240 B2 * | 5/2006 | Lopez | G01K 1/16 |
| | | | 324/750.07 |
| 2009/0009971 A1 * | 1/2009 | Chung | H01L 23/4006 |
| | | | 361/704 |

* cited by examiner

*Primary Examiner* — David Angwin
*Assistant Examiner* — Spencer H Kirkwood
(74) *Attorney, Agent, or Firm* — Muncy, Geissler, Olds & Lowe, P.C.

(57) ABSTRACT

A chip heater and heating air arrangement includes a circuit module including a circuit board, chip unit mounted on the circuit board and locating member mounted around the chip unit, heating aid including flat heat-transfer base panel, locating structure mounted in the flat heat-transfer base panel and attached to the chip unit and mounting structure outwardly extended from the flat heat-transfer base panel and fastened to the locating member, heater fastened to the locating structure of the heating aid, and heat dissipating mechanism including a heat-transfer holder plate attached to the heater. If the temperature of the chip unit goes below 0° C., the heater is turned on to generate heat and enabling generated heat to be transferred through the heating aid to heat the chip unit to the normal operating temperature level, enabling the computer device that uses the chip heater and heating air arrangement to work under cold environment.

8 Claims, 6 Drawing Sheets

CHIP HEATER AND HEATING AID ARRANGEMENT

BACKGROUND OF THE INVENTION

1. Field of the Invention

The present invention relates to computer chip heating technology and more particularly, to a chip heater and heating air arrangement, which uses a heating aid for transferring heat energy from a heater to a chip unit of a circuit module, allowing the chip unit to work normally under a cold environment.

2. Description of the Related Art

Following fast development of technology, advanced computers, notebooks and many other electronic products have been continuously created and widely used in every corner of the society. It is the market trend to create electronic products having light, thin, short and small characteristics with strong computing capabilities and high operating speed. However, during operation of a computer, the CPU, graphic processor and other components of the computer will release waste heat. An electronic component having a relatively higher operation speed can generate a relatively larger amount of waste heat. It is important to provide a computer with a heat dissipation structure, enabling the CPU or other electronic components to work within the normal operating temperature range.

For cooling a chip unit (CPU, video processor, etc.) at a circuit board in a computer, it is the common method to attach a heat sink to the chip unit and then to mount an electric fan on the heat sink. If a chip unit at a circuit board in a computer works at room temperature, it will simply cause a problem of overheat due to high speed operation. However, if a computer is operated outdoors under climate extremes, high humidity and intense sunshine environments, it will be a very stringent test. When using a computer in the day under a very large diurnal temperature environment (such as desert), computer internal heat dissipation device and fan can dissipate latent heat, maintaining normal chip functioning, however, when using a computer at night under low temperature or very cold outdoor environments (such as snow land), the chip in the computer will not be normally started up due to the temperature is too low.

Further, there are demands for computer having ability for wide range operating temperature of −40° C. to 80° C. However, the normal operating temperature of a chip unit at a circuit board is in the range of 0° C. to 75° C. For enabling a computer to work normally under an extremely low temperature (below 0° C.) environment, the temperature inside the computer must be maintained in the normal operating range. It is the normal way to attach a heater to the chip unit at the circuit board. When the environmental temperature is below 0° C., the heater is turned on to generate heat, heating the chip unit to the normal operating temperature range.

However, a chip unit for use in an electronic apparatus having light, thin, short and small characteristics has a complicated structure. A chip unit for advanced computer cannot provide a planar mounting space at the top side (due to arrangement of different sizes of electronic components) for the bonding of a heater. Without a heater, a computer is not suitable for use under an extremely low temperature (below 0° C.) environment.

Therefore, how to solve the drawbacks and inconvenience of the aforesaid conventional techniques is the direction of improvement the related industries need to achieve.

SUMMARY OF THE INVENTION

The present invention has been accomplished under the circumstances in view. It is therefore one object of the present invention to provide a chip heater and heating aid arrangement, which comprises a circuit module, which comprises a circuit board, a chip unit mounted on the circuit board and a locating member mounted around the chip unit, a heating aid, which comprises a flat heat-transfer base panel, a locating structure mounted in the flat heat-transfer base panel and attached to the chip unit and a mounting structure outwardly extended from the flat heat-transfer base panel and fastened to the locating member, a heater fastened to the locating structure of the heating aid, and a heat dissipating mechanism, which comprises a heat-transfer holder plate attached to the heater. If the temperature of the chip unit goes below 0° C., the heater is turned on to generate heat and enabling generated heat to be transferred through the heating aid to heat the chip unit to the normal operating temperature level, enabling the computer device that uses the chip heater and heating air arrangement to work under a cold environment.

Further, the heat dissipating mechanism can absorb heat energy from the chip unit and the heater, and then transfer absorbed heat energy to a top cover shell of a housing that houses the chip heater and heating aid arrangement, enabling heat energy to be quickly dissipated into the outside open air through radiation fins of the top cover shell of the housing to enhance the heat dissipation efficiency of the computer device.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
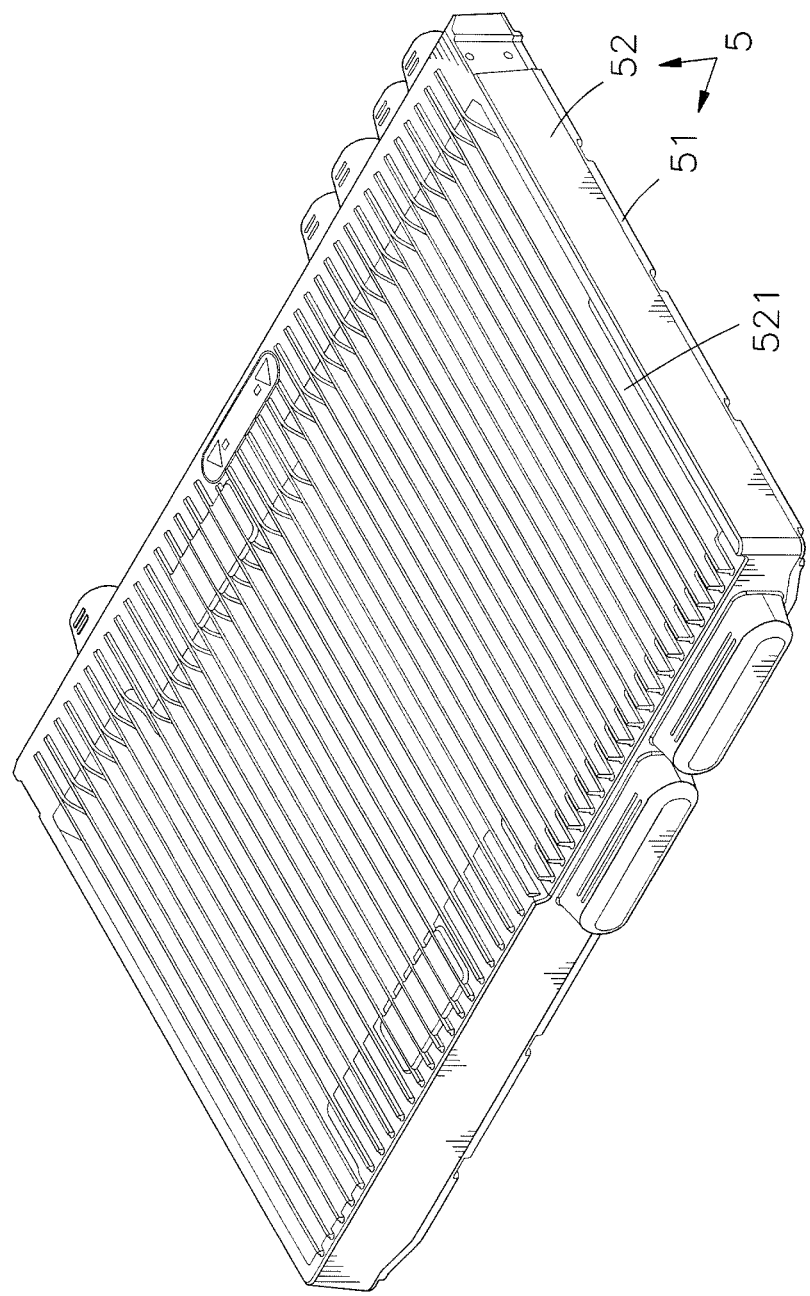
FIG. 1 is an oblique top elevational view of a chip heater and heating aid arrangement in accordance with the present invention.
Figure 2:
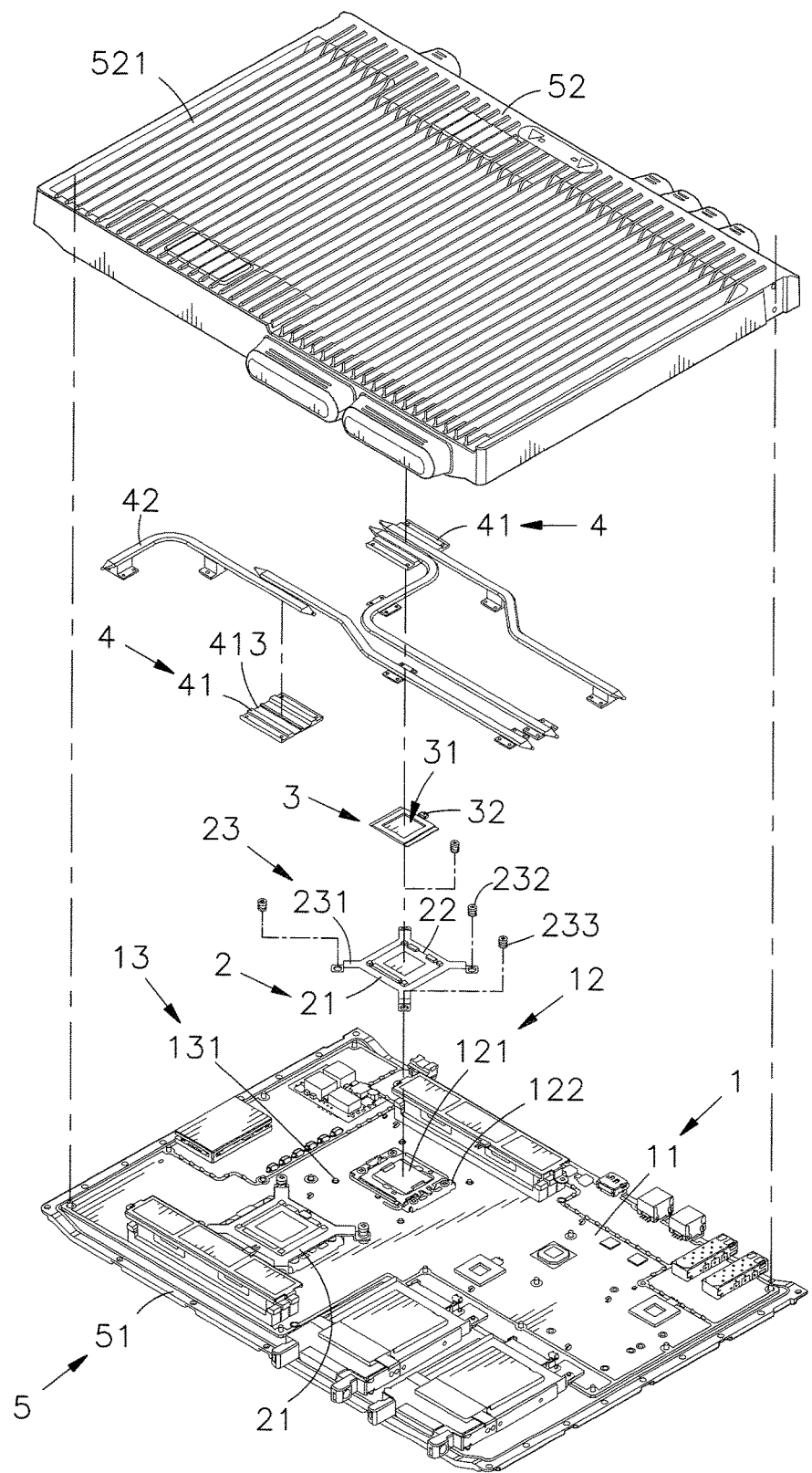
FIG. 2 is an exploded view of the chip heater and heating aid arrangement in accordance with the present invention.
Figure 3:
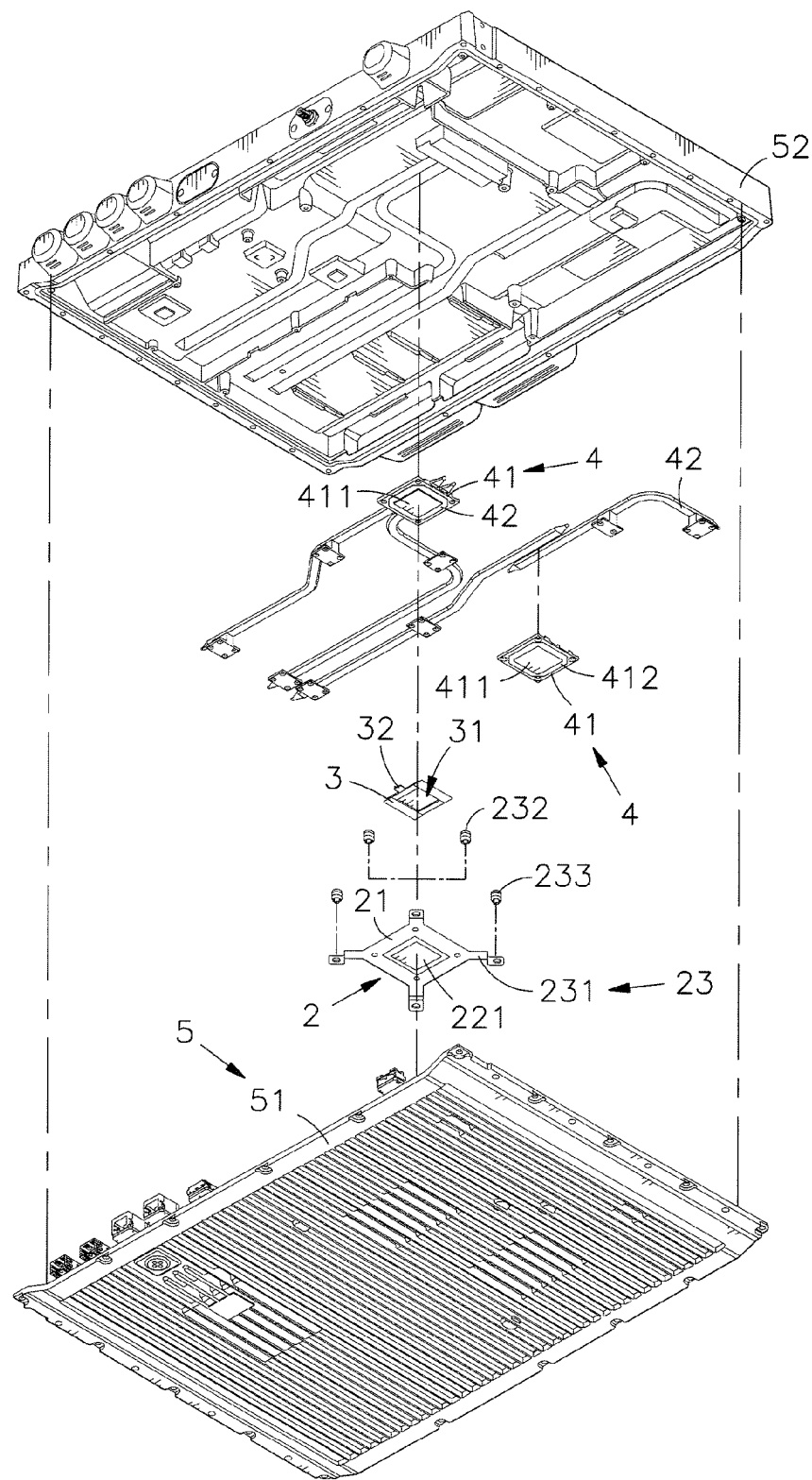
FIG. 3 corresponds to FIG. 2 when viewed from another angle.
Figure 4:
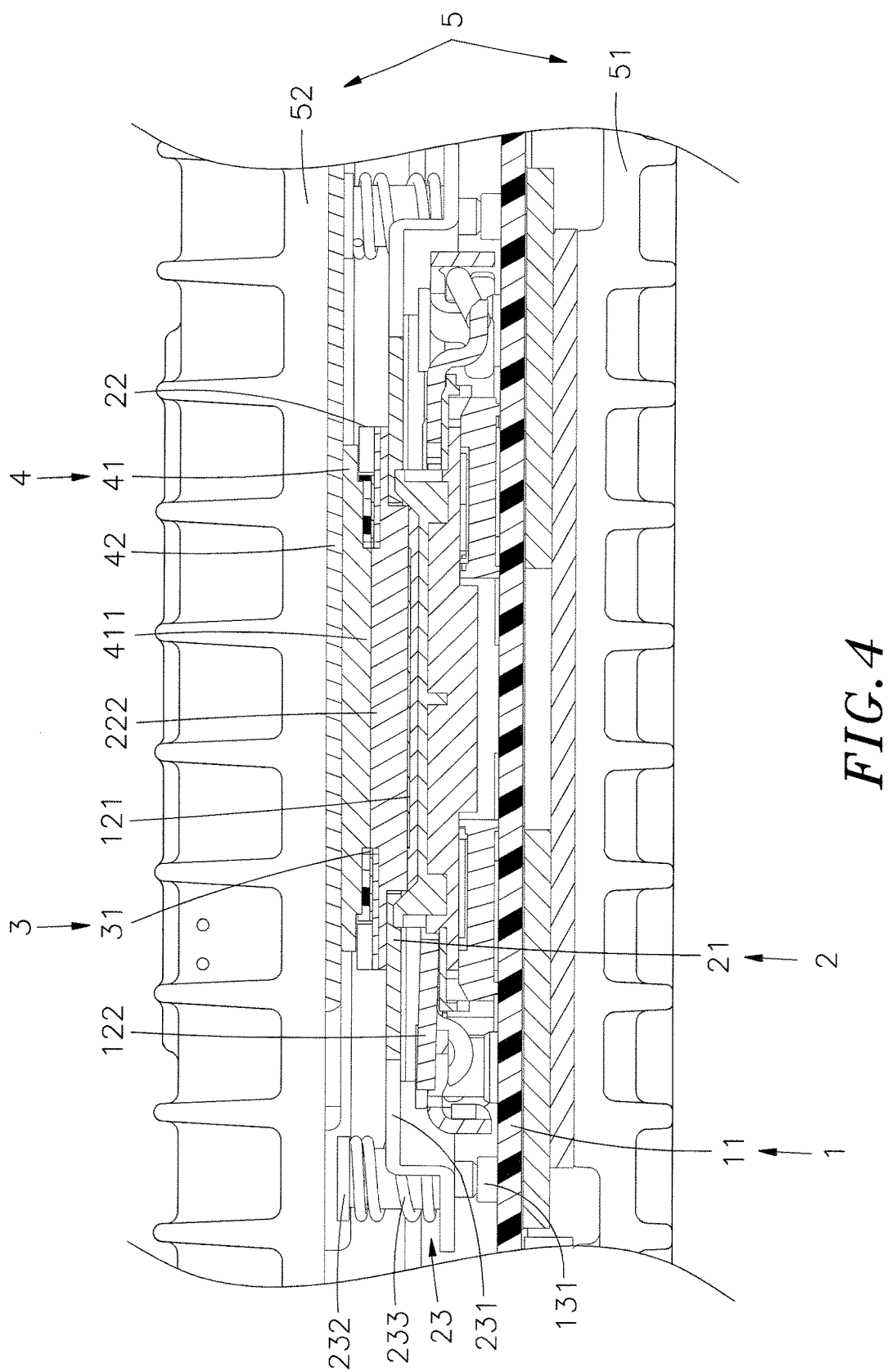
FIG. 4 is a sectional side view, in an enlarged scale, of a part of the chip heater and heating aid arrangement in accordance with the present invention.
Figure 5:
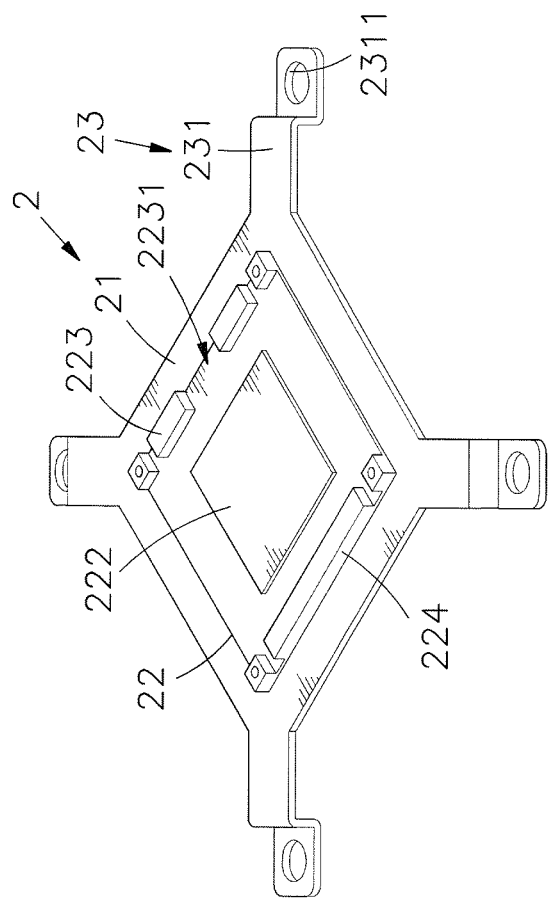
FIG. 5 is an oblique top elevational view of the heating aid of the chip heater and heating aid arrangement in accordance with the present invention.
Figure 6:
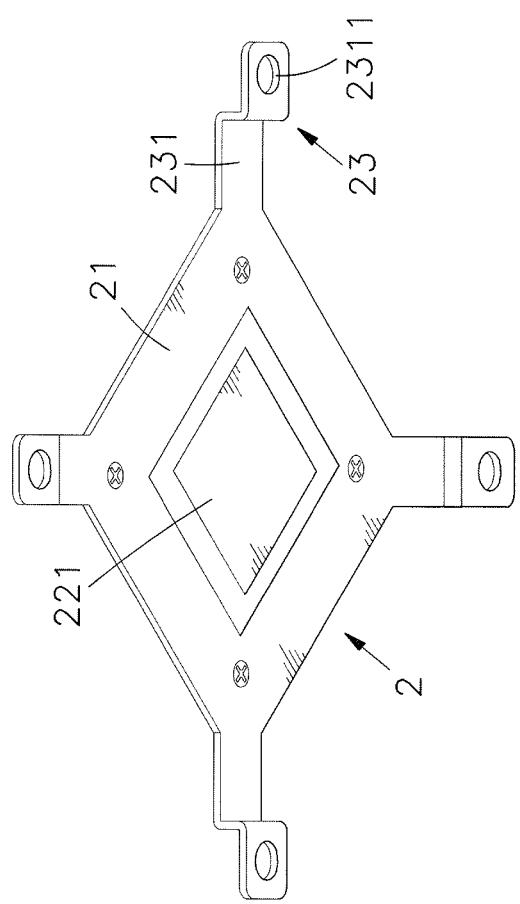
FIG. 6 is an oblique bottom elevational view of the heating aid of the chip heater and heating aid arrangement in accordance with the present invention.

Referring to FIGS. 1-6, a chip heater and heating aid arrangement in accordance with the present invention is shown. As illustrated, the chip heater and heating aid arrangement generally comprises a circuit module 1, at least one heating aid 2, at least one heater 3 and a heat dissipating mechanism 4.

The circuit module 1 comprises a circuit board 11, at least one chip unit 12 installed in the circuit board 11, and a locating member 13 affixed to the circuit board 11 around the at least one chip unit 12 and providing a plurality of mounting holes 131. Each chip unit 12 comprises a chip carrier 122, and a chip 121 bonded to the chip 121 and electrically connected thereto.

Each heating aid 2 comprises an open frame-like flat heat-transfer base panel 21, a locating structure 22 located in the open center of the flat heat-transfer base panel 21, and a mounting structure 23 outwardly extended from corners of the flat heat-transfer base panel 21. The locating structure 22 comprises a contact surface 221 located at a bottom side thereof, a planar raised surface portion 222 located at an opposing top side thereof, two protruding blocks 223 located at the top side and aligned in a line adjacent to one lateral side of the planar raised surface portion 222, an insertion gap 2231 defined between the two protruding blocks 223, and a stop block 224 located at the top side adjacent to an opposite lateral side of the planar raised surface portion 222 opposite to the protruding blocks 223. The mounting structure 23 comprises a plurality of zigzag mounting lugs 231 respectively extended from the corners of the flat heat-transfer base panel 21, a mounting through hole 2311 located at a distal end of each zigzag mounting lug 231, a headed fastening component 232 mounted in each mounting through hole 2311, and a spring member 233 mounted on each headed fastening component 232 and stopped between the head of the respective headed fastening component 232 and the respective zigzag mounting lug 231.

Each heater 3 comprises a through hole 31 cut through opposing top and bottom sides thereof, and power lead wires 32 located at one peripheral side thereof.

The heat dissipating mechanism 4 comprises at least one heat-transfer holder plate 41, a planar heat transfer block 411 bonded to a bottom side of each heat-transfer holder plate 41, a planar bearing surface 412 located at the bottom side of bottom side of each heat-transfer holder plate 41 around the associating planar heat transfer block 411, at least one locating groove 413 located at an opposing top side of each heat-transfer holder plate 41, and a heat-transfer wire rod 42 bonded to each locating groove 413.

The chip 121 of each chip unit 12 of the circuit module 1 can be, for example, a Central Processing Unit (CPU), Field-Programmable Gate Array (FPGA), Graphic Processing Unit (GPU), Graphics and Memory Controller Hub (GMCH) or network-on-chip (NoC) directly bonded to the chip carrier 122 or through a lead frame (not shown) in an electrically conducting manner and encapsulated with an adhesive. In this embodiment, the chip 121 is a Central Processing Unit (CPU).

The at least one heater 3 can be obtained from different manufacturers and made subject to different specifications in any of a variety of shapes and sizes. Each heater 3 can be made in a particular shape and size subject to actual requirements or for a particular application. With respect to the technique for the fabrication of the at least one heater 3 and the technique for conducting the power lead wires 32 to generate heat, these techniques are well know and not within the scope of the spirit of the present invention, no further detailed description in this regard will be given.

The design of each heat-transfer holder plate 41 of the heat dissipating mechanism 4 to provide at least one locating groove 413 for the bonding of the respective at least one heat-transfer wire rod 42 is simply an example for consideration. Alternatively, the heat dissipating mechanism 4 can be configured to provide upright radiation fins (not shown) at each heat-transfer holder plate 41, omitting the aforesaid heat-transfer wire rods 42. Further, an electric fan (not shown) can be mounted at the top side of the upright radiation fins to enhance dissipation of latent heat from each chip unit 12 of the circuit module 1.

In installation, attach one respective heating aid 2 to each chip unit 12 of the circuit module 1 to keep the contact surface 221 of the flat heat-transfer base panel 21 of the respective heating aid 2 in positive contact with each chip unit 12 of the circuit module 1 and to aim the mounting through holes 2311 of the mounting structure 23 at the respective mounting holes 131 of the locating member 13, and then use a hand tool (not shown) to fasten the respective headed fastening components 232 to the respective mounting holes 131 of the locating member 13, affixing each heating aid 2 to the circuit board 11 of the circuit module 1. Thereafter, fasten each heater 3 to the locating structure 22 of one respective heating aid 2 to keep the planar raised surface portion 222 of the locating structure 22 in the through hole 31 of the respective heater 3 and to position the power lead wires 32 of each heater 3 in the insertion gap 2231 between the two protruding blocks 223 of the locating structure 22 of the respective heating aid 2. Thereafter, mount the circuit module 1 with the at least one heating aid 2 and the at least one heater 3 in a bottom shell 51 of a housing 5 of a computer device (not shown), and then affix a top cover shell 52 of the housing 5 to the bottom shell 51. At this time, the planar heat transfer block 411 and planar bearing surface 412 of the heat-transfer holder plate 41 of the heat dissipating mechanism 4 are respectively kept in positive contact with the planar raised surface portion 222 of each heating aid 2 and the surface of each heater 3. Thus, the installation of the chip heater and heating air arrangement is done.

Further, If the temperature detected by the sensing circuit or temperature sensor (not shown) of the circuit board 11 of the circuit module 1 goes below 0° C., the circuit module 1 immediately conducts the power lead wires 32, causing each heater 3 to generate heat and enabling generated heat to be transferred to the respective heating aid 2 and then the chip 121 of each chip unit 12, and thus, the chip 121 of each chip unit 12 can be heated to the normal operating temperature level (for example, ranging from 0° C.~+75° C.).

As soon as the temperature of the chips 121 reaches the normal operating temperature level (0° C.~+75° C.) and the temperature detected by the sensing circuit or temperature sensor (not shown) of the circuit board 11 of the circuit module 1 goes above 0° C., the circuit module 1 immediately cuts off power supply from the power lead wires 32 to turn off each heater 3, Thus, the computer equipment (computer, notebook computer, etc.) carrying the chip heater and heating aid arrangement therein can be operated normally under low temperature or cold outdoor environments, preventing computer equipment shut-down due to low temperature.

As stated above, the invention utilizes the locating structure 22 of each heating aid 2 to carry one respective heater 3. When the at least one heater 3 is turned on to generate heat, generated heat is transferred from each heater 3 through the planar raised surface portion 222 of the locating structure 22 of the respective heating aid 2 to the chip 121 of the respective chip unit 12 of the circuit module 1. In the case that the surface of each chip unit 12 of the circuit module 1 has no room for the installation of one respective heater 3, each heater 3 can be mounted at one respective heating aid 2 for enabling generated heat energy to be transferred through the respective heating aid 2 to heat the respective chip unit 12 of the circuit module 1.

Further, as stated above, the planar heat transfer block 411 at the bottom side of each heat-transfer holder plate 41 of the heat dissipating mechanism 4 is kept in positive contact with the planar raised surface portion 222 of the respective heating aid 2 and the planar bearing surface 412 of each heat-transfer holder plate 41 is abutted against the surface of the respective heater 3, thus, during operation of the chip 121 of each chip unit 12 of the circuit module 1, the heat dissipating mechanism 4 absorbs heat energy from each chip unit 12 and each heater 3, and then transfers absorbed heat energy to the top cover shell 52 of the housing 5 for quick dissipation into the outside open air through the radiation fins 521 of the top cover shell 52 of the housing 5 to enhance the heat dissipation efficiency of the computer device.

In conclusion, the invention provides a chip heater and heating air arrangement, which comprises a circuit module 1 comprising a circuit board 11, at least one chip unit 12 arranged on the circuit board 11, a heating aid 2 attached to each chip unit 12, a heater 3 mounted at each heating aid 2 and controllable to generate heat for heating each chip unit 12 through the respective heating aid 2 when the computer device using the chip heater and heating air arrangement works under a cold environment.

Although a particular embodiment of the invention has been described in detail for purposes of illustration, various modifications and enhancements may be made without departing from the spirit and scope of the invention. Accordingly, the invention is not to be limited except as by the appended claims.

What the invention claims is:

1. A chip heater and heating aid arrangement, comprising a circuit module comprising a circuit board, at least one chip unit mounted at said circuit board, and a locating member mounted at said circuit board around said at least one chip unit;
at least one heating aid mounted at said circuit module, each said heating aid comprising a flat heat-transfer base panel, a locating structure mounted in said flat heat-transfer base panel and kept in positive contact with one respective said chip unit, and a mounting structure outwardly extended from corners of said flat heat-transfer base panel and fastened to said locating member of said circuit module;
a heater fastened to said locating structure of one respective said heating aid opposite to one respective said chip unit; and
a heat dissipating mechanism comprising at least one heat-transfer holder plate mounted at a top side of one respective said heater,
wherein said locating structure of each said heating aid comprises a planar raised surface portion located at a top side thereof; each said heater defines therein a through hole for accommodating the said planar raised surface portion of the said locating structure of one respective said heating aid.

2. The chip heater and heating aid arrangement as claimed in claim 1, wherein each said chip unit of said circuit module comprises a chip carrier, and a chip bonded to said chip carrier and electrically coupled to with said chip carrier; said locating structure of each said heating aid comprises a contact surface located at a bottom side thereof and kept in positive contact with the said chip of one respective said chip unit of said circuit module.

3. The chip heater and heating aid arrangement as claimed in claim 1, wherein said locating member of said circuit module comprises a plurality of mounting holes; said mounting structure of each said heating aid comprises a plurality of zigzag mounting lugs and a mounting through hole located at a distal end of each said zigzag mounting lug and fastened to one respective said mounting hole of said locating member of said circuit module.

4. The chip heater and heating aid arrangement as claimed in claim 3, wherein said mounting structure of each said heating aid further comprises a headed fastening component mounted in the said mounting through hole at each said zigzag mounting lug and fastened to one respective said mounting hole of said locating member of said circuit module, and a spring member mounted on each said headed fastening component and stopped between the head of the respective said headed fastening component and the respective said zigzag mounting lug.

5. The chip heater and heating aid arrangement as claimed in claim 1, wherein said heat dissipating mechanism further comprises a planar heat transfer block bonded to a bottom side of each said heat-transfer holder plate and abutted against said planar raised surface portion of the said locating structure of one respective said heating aid.

6. The chip heater and heating aid arrangement as claimed in claim 5, wherein said heat dissipating mechanism further comprises a planar bearing surface located at the bottom side of each said heat-transfer holder plate around the associating said planar heat transfer block and abutted against each said heater, at least one locating groove located at an opposing top side of each said heat-transfer holder plate, and a heat-transfer wire rod bonded to each said locating groove.

7. The chip heater and heating aid arrangement as claimed in claim 1, wherein said locating structure of each said heating aid further comprises two protruding blocks located at the top side and aligned in a line, an insertion gap defined between said two protruding blocks; each said heater comprises a plurality of power lead wires located at one lateral side thereof and positioned in said insertion gap of said locating structure of the respective said heating aid.

8. The chip heater and heating aid arrangement as claimed in claim 7, wherein said locating structure of each said heating aid further comprises a stop block located at the top side thereof opposite to said protruding blocks.

* * * * *